US00RE36446E

United States Patent [19]

Lumbard et al.

[11] E Patent Number: Re. 36,446

[45] Reissued Date of Patent: Dec. 14, 1999

[54] METHOD FOR PRODUCING DISPLAYS AND MODULAR COMPONENTS

[75] Inventors: Marvin Lumbard, Los Gatos; Lynn K. Wiese, Santa Clara, both of Calif.

[73] Assignee: Infineon Technologies Corporation, San Jose, Calif.

[21] Appl. No.: 09/118,747

[22] Filed: Jul. 17, 1998

Related U.S. Patent Documents

Reissue of:

[64] Patent No.: 4,890,383
Issued: Jan. 2, 1990
Appl. No.: 07/338,720
Filed: Apr. 14, 1989

U.S. Applications:

[

[62] Division of application No. 07/144,370, Jan. 15, 1988, Pat. No. 4,843,280.

[51] Int. Cl.[6] ..... H01L 21/56; H05B 43/00

[52] U.S. Cl. ..... 438/27; 29/841; 29/852; 438/113; 438/28; 438/33; 445/24

[58] Field of Search ..... 438/27, 28, 33, 438/113; 445/24; 29/841, 852

[56] References Cited

U.S. PATENT DOCUMENTS

| | | | |
|---|---|---|---|
| 3,189,978 | 6/1965 | Stetson | 28/851 X |
| 3,908,184 | 9/1975 | Anazawa et al. | 174/52.4 X |
| 4,000,437 | 12/1976 | Lederhandler et al. | 313/512 X |
| 4,305,204 | 12/1981 | Toggart et al. | 29/841 |
| 4,445,132 | 4/1984 | Ichikawa et al. | 313/500 X |
| 4,508,758 | 4/1985 | Wong | 29/841 |
| 4,525,597 | 6/1985 | Abe | 174/52.4 |
| 4,603,496 | 8/1986 | Latz et al. | 313/500 X |
| 4,713,579 | 12/1987 | Miura | 313/500 |

FOREIGN PATENT DOCUMENTS

| | | | |
|---|---|---|---|
| 5-113387 | 9/1980 | Japan | 313/500 |
| 56-135984 | 10/1981 | Japan . | |
| 56-137466 | 10/1981 | Japan . | |
| 61-134040 | 6/1986 | Japan | 29/835 |
| 175735 | 6/1961 | Sweden | 313/506 |

*Primary Examiner*—Kenneth J. Ramsey

[57] ABSTRACT

Processing techniques for various modular components provide various surface mount structures for single device components (10) and multiple device components (FIGS. 6 and 7) suitable as character displays. The technique beings with a slab of substrate material 12 patterned on both sides. Plated through holes (33, 43) connecting back side terminals (19, 20) to front side connective strips (22, 24) are formed. Devices (15, 16) are mounted to land areas (13, 34) and wire bonded to connecting pads (14). The front side is coated with epoxy to encapsulate the devices in a layer having an outer surface formed into optional lenses (262, 263). The slab is then separated to provide the modular components.

34 Claims, 2 Drawing Sheets

METHOD FOR PRODUCING DISPLAYS AND MODULAR COMPONENTS

Matter enclosed in heavy brackets [ ] appears in the original patent but forms no part of this reissue specification; matter printed in italics indicates the additions made by reissue.

This is a division of application Ser. No. 144,370, filed Jan. 15, 1988, now U.S. Pat. No. 4,843,280.

BACKGROUND OF THE INVENTION

This invention relates to electro-optical displays and other modular compact components. In particular, the invention relates to a method of manufacturing such components capable of being fully automated for producing low cost modular components also highly suitable for automated assembly in installations.

Display devices are used extensively particularly in digital circuitry to provide information for the interface for the user. However, with the advances in integrated circuitry technology progressively providing increased processing power in smaller space at reduced costs, the cost of interface devices, such as displays, becomes a larger portion of the total cost and thus more significant. Also when the cost of displaying information is low, the additional cost of displaying more information when desirable is not a deterent leading to greater design freedom. In view of these economic or cost saving benefits, it is extremely desirable to have a fully automated manufacturing process for producing display devices.

Another consideration in display devices as electronic components is modular construction. From a packaging stand-point, the display device should be sealed to prevent physical damage during automated assembly and contamination after assembly. Versatility is also advantageous to limit constraints on product design and packaging. Furthermore, it would be desirable for the display package to have terminals suitable for surface mount soldering. Of course, compactness of size is highly desirable in addition to the previously enumerated considerations and sought after advantages.

SUMMARY OF THE INVENTION

An object of the present invention is to provide a novel and improved method of manufacturing modular components in which the manufacturing costs are considerably lower than those known from the prior art and in which at the same time the packaging features are at least the equal of those known from the prior art.

Another object of the invention is to provide a method of manufacturing modular display components that is adaptable to mass production techniques.

A further object of the invention is the provision of a novel method of manufacturing modular components, each component having a plurality of devices being arranged in the form of lines and columns.

Yet another object of the invention is to provide a method of manufacturing an alpha-numeric display device having a modular structure and which can be placed side by side to display characters in both vertical and horizontal formats.

A still further object of the invention is the provision of a method of manufacturing modular components which are highly suitable for automated assembly installations.

Another aim of the invention is the provision of packed modular components formed by the method described herein.

In accordance with one form of the present invention the method comprises, and the product of such method is formed by the steps of:

(a) providing an electrically insulating, generally planar substrate having two opposing major surfaces, the first of said two major surfaces including a plurality of land areas for receiving devices to be mounted thereon and a plurality of connection pads, the second of said two major surfaces including a plurality of terminal pads serving as external terminals for mounted devices, and plated through holes for providing electrical connections between some of the external terminals to the land areas and between the remaining external terminals to the connection pads;

(b) mounting at least one device having at least two terminals on individual land areas so that one terminal is electrically and mechanically coupled to one of said land areas and electrically connected to its corresponding external terminal;

(c) electrically connecting any remaining terminals of each device to respective ones of said connection pads;

(d) depositing a curable layer of insulative material onto said first major surface for encapsulating said devices including electrical connections made in step (c);

(e) curing said layer of insulative material at least partially; and (f) dividing the planar substrate including the layer of insulative material into individual modular components, each individual modular component including at least one device mounted therein and encapsulated by the layer of insulative material and electrically connected to its external terminals.

When the above method is employed the features of mounting a plurality of devices on a planar substrate and dividing the planar substrate into individual modular components renders the method highly suitable for fully automated and therefore low cost production.

BRIEF DESCRIPTION OF THE DRAWING

Features of the invention and additional aspects and objects of the invention will be more readily appreciated and better understood by reference to the following detailed description which should be considered in conjunction with the drawing in which.

DETAILED DESCRIPTION OF THE PREFERRED EMBODIMENTS

Figure 1:
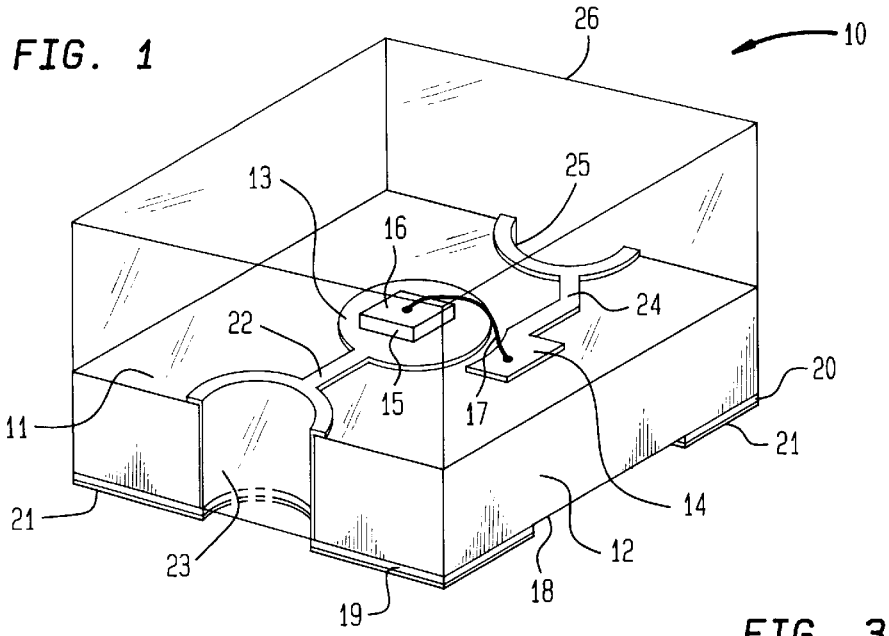
FIG. 1 is a perspective view of a modular compact component including a light emitting diode which is encapsulated in transparent epoxy.

FIG. 1 demonstrates the construction of a typical modular component 10 that may be manufactured according to the present invention. Deposited onto the upper side 11 of a flat substrate 12 of an electrically insulating material, for instance synthetic plastic material or the like, is a conductive pattern of highly conductive material such as copper. The conductive pattern deposited onto the upper side 11 defines a land area 13 and a connection pad 14. A light emitting diode 15 is mounted on the land area 13 so that its terminal on the underneath or back side is electrically and mechanically coupled to the land area 13. The upper side of the light emitting diode 15 is provided with a terminal 16 which is electrically conductive and connected with the connection pad 14 via a bonding wire 17.

Deposited onto the rear of back side 18 of the flat substrate 12 is a second conductive pattern of highly conductive material such as copper. This second conductive pattern defines a first terminal pad 19 and a second terminal pad 20. Both terminal pads 19 and 20 externally are coated with a layer of solder 21 in order to make the modular component 10 suitable for surface mount soldering.

The land area 13 on the upper side 11 of the substrate 12 is provided with an extension 22 which is electrically connected to the terminal pad 19 on the under side 18 via a plated through groove 23 having a semicircular cross-section. Similarly, the connection pad 14 on the upper side 11 of the substrate 12 is provided with an extension 24 which is electrically connected to the terminal pad 20 on the under side 18 via a plated through groove 25, which is preferably identical to the plated through groove 23. In this manner the two terminal pads 19 and 20 serve as external terminals for the light emitting diode 15 which mechanically secures modular component 10 during surface mounting of the component.

It is to be understood that the plated through grooves 23 and 25 are located at opposing edges of the substrate 12, so that they can be produced by dividing plated through holes into two substantially equal parts. As will be seen hereinafter such dividing of plated through holes can be advantageously adapted to mass production techniques with the present invention.

The modular component 10 is provided with a transparent covering 26 for protective purposes. Thus the light emitting diode 15 and its electrical contacts including the bonding wire 17 are sealed and encapsulated in the covering 26 which may comprise of synthetic resin, silicone rubber or other suitable transparent and insulative material. According to a preferred illustrative embodiment of the present invention the covering 26 is made from clear or diffused epoxy, which provides especially good optical characteristics.

In the illustrative embodiment of FIG. 1, the covering 26 of the modular component 10 has a cubical shape with a planar upper surface. Other embodiments for different purposes and with different shapes of the coverings are shown in FIGS. 2, 3 and 4.

Figure 2:
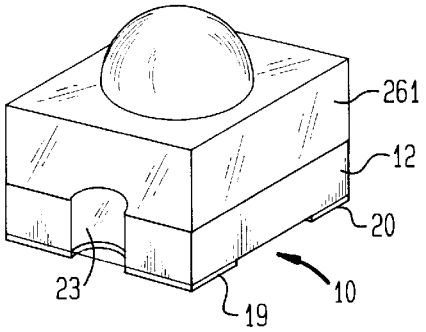
FIG. 2 is a view similar to FIG. 1 but illustrating a second illustrative embodiment with a dome lens top.

FIG. 2 illustrates an illustrative embodiment of the present invention in which the modular component 10 is provided with a covering 261 forming a generally hemispherically shaped lens above the light emitting diode 15.

Figure 3:
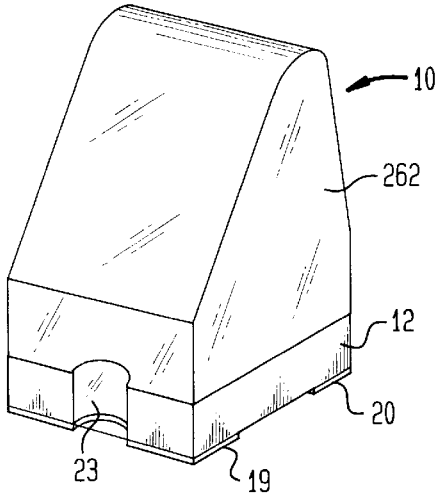
FIG. 3 is a view similar to FIG. 1 but depicting a third illustrative embodiment having a prism top.

FIG. 3 illustrates an illustrative embodiment in which the modular component 10 is provided with a covering 262 forming a prism over the light emitting diode 15. This prism is suitable for side emitting.

Figure 4:
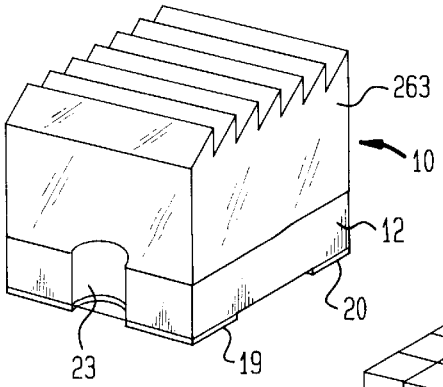
FIG. 4 is a view similar to FIG. 1 but showing a fourth illustrative embodiment with a fresnal prism top.

FIG. 4 shows a further illustrative embodiment in which the modular component 10 is provided with a covering 263 forming a fresnal prism over the light emitting diode 15. This fresnal prism is suitable for lateral or top emission of light.

In order to mass produce modular components in the most economical manner, all necessary steps are performed while the substrates 12 corresponding to a plurality of modular components 10 are coherent in the form of a panel. An appropriate method of manufacturing the modular components 10 corresponding to FIG. 1 will subsequently be described.

The method starts with a generally planar substrate 12 metalized with 3 mil copper on both sides. First, holes are drilled in the substrate 12 and then plated through to provide electrical connections between the upper side 11 to the under side 18. Next conductive patterns are formed on both sides of the substrate 12 by masking and etching. Techniques for forming conductive patterns are well-known and form no part of the present invention and therefore will not be discussed in further detail herein. The conductive patterns of the substrate 12 include on the upper side 11 a plurality of land areas 13 with the corresponding extensions 22 and a plurality of connection pads with the corresponding extensions 24.

On the under side 18 of the substrate 12, the conductive patterns include a plurality of terminal pads 19 and 20 which are arranged in pairs around the plated through holes. Then a gasket tape is applied to the under side 18 of the substrate 12. Subsequently, light emitting diodes 15 are mounted on the land areas 13 so that their terminals on their under sides are electrically and mechanically coupled to the corresponding land areas 13. The terminals 16 on the upper sides of the light emitting diodes are then electrically connected to their corresponding connection pads 14 via bonding wires 17. After this wire bonding, a test is performed automatically utilizing a probe station and defective light emitting diodes 15 are identified. In the next step, either reworking is possible to correct malfunctioning light emitting diodes 15 by rebonding and/or repair wire 17 or malfunctioning light emitting diodes 15 are replaced.

Liquid epoxy is deposited onto the upper side 11 of the substrate 12 in a sufficient quality so as to provide a coating of a thickness that will encapsulate all the light emitting diodes 15 and the bonding wires 17. The deposition of epoxy onto the substrate 12 is performed as a coating or casting operation. Then the liquid epoxy is degassed in a controlled ambient vessel utilizing a pressure less than atmospheric pressure in order to remove bubbles. Thereafter the epoxy is cured and after this curing step the gasket tape is peeled off the under side 18 of the substrate 12 since it has no longer to prevent the flow of liquid epoxy through the plated through holes.

Then the substrate 12 is inverted and a test is performed with a wafer prober using a glass stage with an optical sensor under the stage. This step is performed to test the light emitting diodes 15 for output. After this testing step, the external surfaces of all terminal pads 19 and 20 on the back side 18 of the substrate 12 are coated with a layer of solder 21. Techniques for depositing solder on terminal pads are well-known and form no part of the present invention, and therefore will not be discussed herein. According to FIG. 5, an adhesive carrier 27 is subsequentlY applied to the underneath surface 18 of the substrate 12 and the substrate 12 is sawed into strips 28 held together by the adhesive carrier 27. Then the strips 28 are cut into individual modular components 10 which are illustrated in FIG. 1. This second cut is in a direction that is at a right angle to the first cut.

Figure 5:
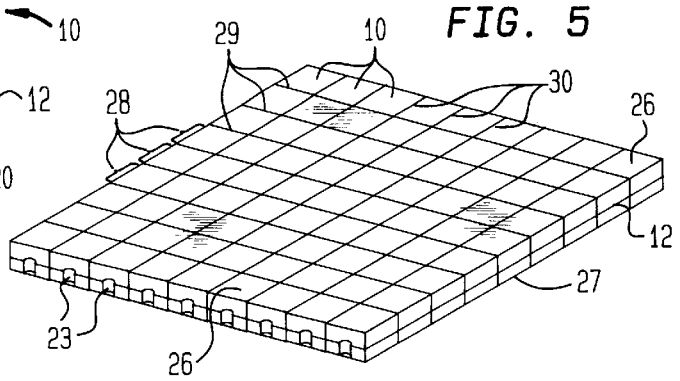
FIG. 5 demonstrates a step in a method of manufacturing in accordance with the invention having a plurality of modular compact components of the type shown in FIG. 1.

In FIG. 5, the first cuts are designated with reference numerals 29 and the second cuts are designated with reference numerals 30. It can be seen that the first cuts 29 divide the plated through holes into substantially equal parts having semicircular cross-sections, e.g. each plated through hole is divided into a first plated through groove 23 and a second plated through groove 25, which are both present in FIG. 1 but for two adjacent plated through holes.

After the cutting of the strips 28 the individual modular components 10 are packed in a bubble tape for automatic pick and place equipment.

Figure 6:
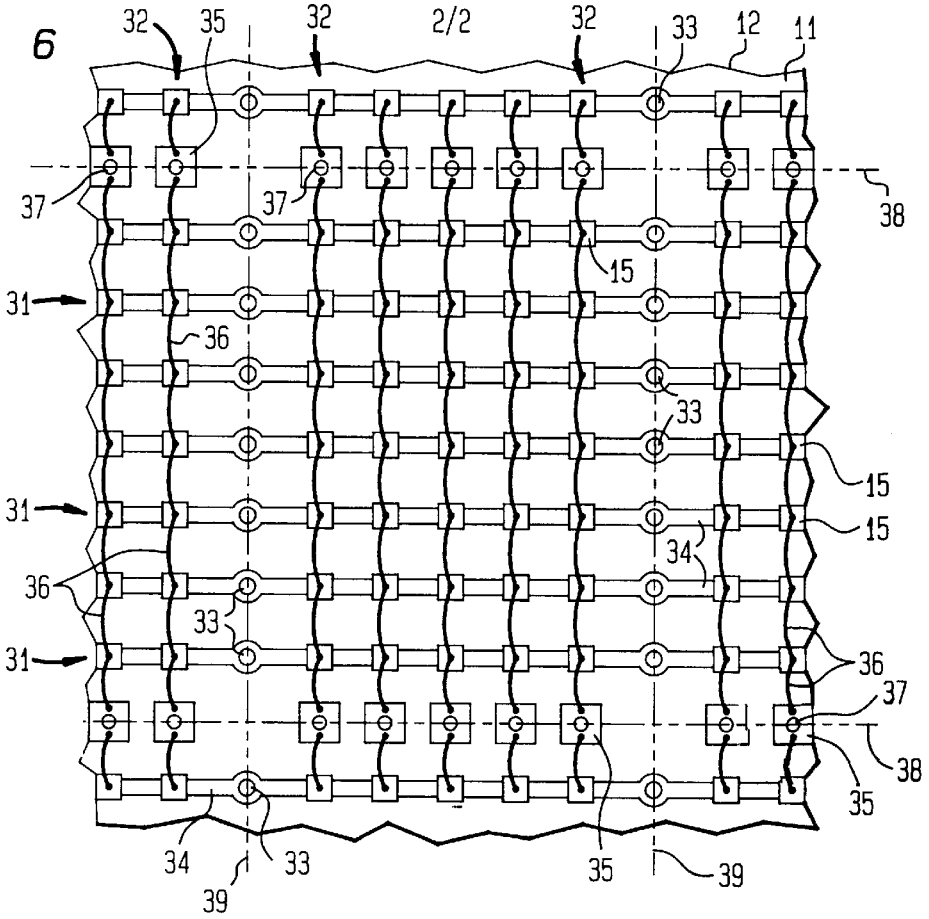
FIG. 6 is a partial plan view on a planar substrate with a matrix arrangement of light emitting diodes.

FIG. 6 is a partial plan view on a planar substrate 12 having a plurality of light emitting diodes 15 arranged on its upper side 11 to form lines 31 and columns 32. The portion of the land areas corresponding to the light emitting diodes 15 forming each line 31 are interconnected together and to a plurality of plated through holes 33 in the form of conductive strips 34. The plated through holes 33 are arranged in equal distances on the conductor strips 34 so as to allow the mounting of five light emitting diodes 15 on the corresponding land area portions between each two plated through holes 33.

The terminals on the upper sides of the light emitting diodes 15 corresponding to each column 32 are connected to each other and to a plurality of connection pads 35 by bonding wires 36. The connection pads 35 are perforated by plated through holes 37 so as to provide electrical connection to terminal pads on the under side of the substrate 12. The connection pads 35 and plated through holes 37 corresponding to the light emitting diodes 15 forming each column 32 are arranged in equal distances so as to allow the mounting of seven light emitting diodes 15 between each two plated through holes 37.

After the mounting, wiring and encapsulating of the light emitting diodes 15, the planar substrate 12 is divided into individual modular components. Each individual modular component has a matrix arrangement of 5×7 light emitting diodes 15. In FIG. 6, the cut lines which are parallel to the lines 31 are designated with reference numerals 38 and the cut lines which are parallel to the columns 32 are designated with reference numerals 39. It can be seen that the cut lines 38 will divide each of the plated through holes 37 into two substantially equal parts, each part forming a plated through groove similar to the plated through grooves 23 and 25 shown in FIG. 1. Likewise the cut lines 39 will divide each of the plated through holes 33 into two substantiallY equal parts, each part providing a plated through groove similar to the plated through grooves 23 and 25 shown in FIG. 1.

Figure 7:
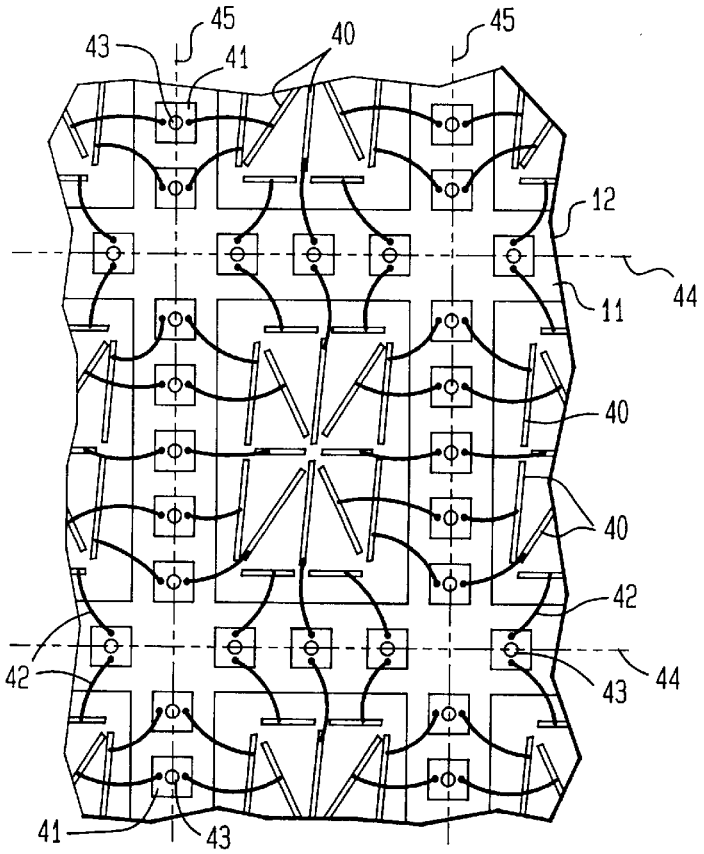
FIG. 7 is a partial plan view on a planar substrate bearing a plurality of individual digit character displays having sixteen segment fonts.

FIG. 7 is a partial plan view on a planar substrate 12 having a plurality of light emitting diodes 40 arranged on its upper side 11 to form a plurality of multiple segment joints or single character displays. Each segment of the multiple segment joint corresponds to a light emitting diode 40 which is mounted on a corresponding land area. Each terminal on the upper side of a light emitting diode 40 is connected to a separate connection pad 41 by a bonding wire 42. Each connection pad 41 is perforated by a plated through hole 43 so as to provide electrical connection to corresponding terminal pads on the under side of the substrate 12.

After the mounting, wiring and encapsulating of the light emitting diodes 40, the planar substrate 12 is divided into individual modular components. Each individual modular component functions as a single character display. In FIG. 7, the horizontal cut lines are designated with reference numerals 44 while the vertical cut lines are designated with reference numerals 45. It can be seen that the cut lines 44 and 45 will divide each of the plated through holes 43 into two substantially equal parts, each part forming a plated through groove like the plated through grooves 23 and 25 shown in FIG. 1.

The present invention provides an inexpensive technique for making surface mounted semiconductor packages. Diodes, photo sensitive devices, resistors or integrated circuits could be manufactured in panel form casing with a protective coating which maybe opaque. The panel can be tested prior to coating and after coating and sawed apart using the method described above.

There has thus been shown and described a novel method of manufacturing modular components which fulfills all the objects and advantages sought therefor. Many changes, modifications, variations and other uses and applications of the subject invention will, however, become apparent to those skilled in the art after considering this specification and the accompanying drawings which disclose preferred embodiments thereof. For example, different arrangements of devices are readily possible while utilizing the principles of the disclosed technique. Such arrangements may also have locations for plated through holes other than at the sides of the modular components, and the present techniques may also be extended to include multiple conductive layers and laminated substrate layers.

All such changes, modifications, variations and other uses and applications which do not depart from the spirit and scope of the invention are deemed to be covered by the invention which is limited only by the claims which follow.

What is claimed is:

1. A method of manufacturing modular components, comprising the steps of:

(a) providing an electrically insulating, generally planar substrate having two opposing major surfaces, the first of said two major surfaces including a plurality of land areas for receiving devices to be mounted thereon and a plurality of connection pads, the second of said two major surfaces including a plurality of terminal pads serving as external terminals for mounted devices, and plated through holes for providing electrical connections between some of the external terminals to the land areas and between the remaining external terminals to the connection pads;

(b) mounting at least one device having at least two terminals on individual land areas so that one terminal is electrically and mechanically coupled to one of said land areas and electrically connected to its corresponding external terminal;

(c) electrically connecting any remaining terminals of each device to respective ones of said connection pads;

(d) depositing a curable layer of insulative material onto said first major surface for encapsulating said devices including electrical connections made in step (c);

(e) curing said layer of insulative material at least partially; and (f) dividing the planar substrate including the layer of insulative material into individual modular components, each individual modular component including at least one device mounted therein and encapsulated by the layer of insulative material and electrically connected to its external terminals.

2. The method according to claim 1 wherein said step of electrically connecting any remaining terminals of *each* device to respective ones of said connection pads comprises bonding a wire between each connection pad and *a corresponding* remaining terminal.

3. The method according to claim 1 wherein said devices mounted on said land areas are light emitting diodes and wherein said curable layer of insulative material is at least partially transparent to the light emitted by the light emitting diodes.

4. The method according to claim 1 wherein said curable layer of insulative material is an epoxy material.

5. The method according to claim [1] *3* wherein said step of depositing a curable layer of insulative material includes forming a generally hemispherically shaped lens in the region above each light emitting diode.

6. The method according to claim [1] *3* wherein said step of depositing a curable layer of insulative material includes forming a prism of insulative material over each light emitting diode.

7. The method according to claim [1] *3* wherein said step of depositing a curable layer of insulative material includes forming a fresnal prism of insulative material over each light emitting diode.

8. The method according to claim 1 wherein said step of curing said layer of insulative material is preceded by the step of degassing said insulative material under a pressure less than atmospheric pressure.

9. The method according to claim 1 wherein after said step of curing said layer of insulative material said terminal pads are coated with solder.

10. The method according to claim 1 further comprising the step of applying an adhesive carrier onto said second major surface prior to said step of dividing the planar substrate.

11. The method according to claim 1 wherein said plated through holes are arranged in the form of parallel straight lines and said step of dividing the planar substrate comprises dividing said plated through holes into substantially equal parts having semicircular cross-sections.

12. The method according to claim 1 wherein said step of dividing comprises sawing the planar substrate.

13. The method according to claim 1 wherein said step of dividing is carried out by first sawing the substrate into strips and then cutting said strips up into individual modular components.

14. The method according to claim 1 wherein the step of mounting comprises a plurality of devices on the plurality of land areas being arranged to form lines and columns, the portion of the land areas corresponding to the devices forming each line being interconnected together and being connected to at least one of said plated through holes, said remaining terminals of devices corresponding to each column being connected to each other and to at least one of said plated through holes by a bonding wire and said step of dividing includes forming individual modular components, each individual modular component having a plurality of devices arranged in lines and columns.

15. The method according to claim 14 wherein said step of dividing includes dividing at least some of said plated through holes into two portions, each portion having a generally semicircular cross-section.

16. The method according to claim 1 wherein said devices mounted on said land areas are light emitting diodes, a plurality of said light emitting diodes forming a multiple segment font having each segment corresponding to a light emitting diode and wherein said step of dividing said planar substrate includes forming individual modular components, whereby each individual modular component functions as a single character display.

17. The method according to claim 16 wherein said step of dividing includes dividing at least some of said plated through holes into two portions, each portion having a generally semicircular cross-section.

*18. A method of manufacturing modular components, comprising the steps of:*

(*a*) *providing an electrically insulating, generally planar substrate having two opposing major surfaces, the first of said two major surfaces including a plurality of land areas for receiving devices to be mounted thereon and a plurality of connection pads, the second of said two major surfaces including a plurality of terminal pads serving as external terminals for mounted devices, and plated through holes for providing electrical connections between some of the external terminals to the land areas and between the remaining external terminals to the connection pads;*

(*b*) *mounting at least one device having at least two terminals on individual land areas so that one terminal is electrically and mechanically coupled to one of said land areas and electrically connected to its corresponding external terminal;*

(*c*) *electrically connecting any remaining terminals of each device to respective ones of said connection pads;*

(*d*) *depositing a curable layer of insulative material onto said first major surface for encapsulating said devices including electrical connections made in step* (*c*);

(*e*) *curing said layer of insulative material at least partially; and*

(*f*) *dividing the planar substrate and the layer of insulative material into individual modular components, each individual modular component including at least one device mounted therein and encapsulated by a portion of the divided layer of insulative material and electrically connected to its external terminals.*

*19. The method according to claim 18 wherein said step of electrically connecting any remaining terminals of each device to respective ones of said connection pads comprises bonding a wire between each connection pad and a corresponding remaining terminal.*

*20. The method according to claim 18 wherein said devices mounted on said land areas are light emitting diodes and wherein said curable layer of insulative material is at least partially transparent to the light emitted by the light emitting diodes.*

*21. The method according to claim 18 wherein said curable layer of insulative material is an epoxy material.*

*22. The method according to claim 18 wherein said step of depositing a curable layer of insulative material includes forming a generally hemispherically shaped lens in the region above each light emitting diode.*

*23. The method according to claim 18 wherein said step of depositing a curable layer of insulative material includes forming a prism of insulative material over each light emitting diode.*

*24. The method according to claim 18 wherein said step of depositing a curable layer of insulative material includes forming a fresnal prism of insulative material over each light emitting diode.*

*25. The method according to claim 18 wherein said step of curing said layer of insulative material is preceded by the step of degassing said insulative material under a pressure less than atmospheric pressure.*

*26. The method according to claim 18 wherein after said step of curing said layer of insulative material said terminal pads are coated with solder.*

*27. The method according to claim 18 further comprising the step of applying an adhesive carrier onto said second major surface prior to said step of dividing the planar substrate.*

*28. The method according to claim 18 wherein said plated through holes are arranged in the form of parallel straight lines and said step of dividing the planar substrate and the layer of insulative material comprises dividing said plated*

*through holes into substantially equal parts having semicircular cross-sections.*

*29. The method according to claim 18 wherein said step of dividing the planar substrate and the layer of insulative material comprises sawing the planar substrate and the layer of insulative material.*

*30. The method according to claim 18 wherein said step of dividing the planar substrate and the layer of insulative material is carried out by first sawing the substrate and the layer of insulative material into strips and then cutting said strips up into individual modular components.*

*31. The method according to claim 18 wherein the step of mounting comprises a plurality of devices on the plurality of land areas being arranged to form lines and columns, the portion of the land areas corresponding to the devices forming each line being interconnected together and being connected to at least one of said plated through holes, said remaining terminals of devices corresponding to each column being connected to each other and to at least one of said plated through holes by a bonding wire and said step of dividing the planar substrate and the layer of insulative material includes forming individual modular components, each individual modular component having a plurality of devices arranged in lines and columns.*

*32. The method according to claim 31 wherein said step of dividing the planar substrate and the layer of insulative material includes dividing at least some of said plated through holes into two portions, each portion having a generally semicircular cross-section.*

*33. The method according to claim 18 wherein said devices mounted on said land areas are light emitting diodes, a plurality of said light emitting diodes forming a multiple segment font having each segment corresponding to a light emitting diode and wherein said step of dividing said planar substrate includes forming individual modular components, whereby each individual modular component functions as a single character display.*

*34. The method according to claim 33 wherein said step of dividing the planar substrate and the layer of insulative material includes dividing at least some of said plated through holes into two portions, each portion having a generally semicircular cross-section.*

* * * * *